(12) United States Patent
Lee et al.

(10) Patent No.: US 11,404,556 B2
(45) Date of Patent: Aug. 2, 2022

(54) FET USING TRENCH ISOLATION AS THE GATE DIELECTRIC

(71) Applicant: Texas Instruments Incorporated, Dallas, TX (US)

(72) Inventors: Zachary Ka Fai Lee, Fremont, CA (US); YuGuo Wang, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/087,379

(22) Filed: Nov. 2, 2020

(65) Prior Publication Data

US 2022/0140105 A1    May 5, 2022

(51) Int. Cl.
| H01L 29/51 | (2006.01) |
| H01L 21/762 | (2006.01) |
| H01L 29/423 | (2006.01) |
| H01L 29/66 | (2006.01) |
| H01L 21/8238 | (2006.01) |
| H01L 29/06 | (2006.01) |
| H01L 29/78 | (2006.01) |

(52) U.S. Cl.
CPC ...... *H01L 29/517* (2013.01); *H01L 21/76224* (2013.01); *H01L 21/823878* (2013.01); *H01L 29/0653* (2013.01); *H01L 29/4236* (2013.01); *H01L 29/42368* (2013.01); *H01L 29/66681* (2013.01); *H01L 29/7824* (2013.01)

(58) Field of Classification Search
CPC ....... H01L 21/823878; H01L 29/66681; H01L 29/7824; H01L 29/0653
See application file for complete search history.

(56) References Cited

U.S. PATENT DOCUMENTS

| 10,396,196 | B1* | 8/2019 | Chang | H01L 29/0653 |
| 2016/0035884 | A1* | 2/2016 | Fang | H01L 21/26513 |
| | | | | 257/343 |
| 2018/0358258 | A1 | 12/2018 | Lee et al. | |

* cited by examiner

*Primary Examiner* — Joseph C. Nicely
(74) *Attorney, Agent, or Firm* — Jacqueline J. Garner; Charles A. Brill; Frank D. Cimino

(57) ABSTRACT

A semiconductor device includes a Silicon-on-Insulator (SOI) substrate including a top device layer, a buried oxide (BOX) layer, and a bottom handle portion. A filled trench is lined with a trench dielectric layer that extends to at least the BOX layer, defining an inner and an outer portion of the device layer. A field effect transistor (FET) includes an inner portion, a source region having a source contact thereto and a drain region having a drain contact thereto, each doped a first doping type. A gate region has a gate contact that is separated from the inner portion by the trench dielectric. The source and drain region are separated by a body region doped a second doping type having a body contact.

22 Claims, 15 Drawing Sheets

FET USING TRENCH ISOLATION AS THE GATE DIELECTRIC

FIELD

This Disclosure relates to silicon-on-insulator (SOI) based semiconductor devices.

BACKGROUND

SOI is a semiconductor technology that produces higher performing, lower power (dynamic) semiconductor devices as compared to traditional bulk silicon-based technology. SOI substrates are used for a variety of applications including Micro-Electro-Mechanical Systems (MEMS), power devices, and complementary metal-oxide-semiconductor (CMOS) integrated circuits (ICs). The SOI wafer comprises a sandwich structure including a device layer (or active layer) on the top, a buried oxide (BOX) layer (a dielectric layer typically being silicon oxide) in the middle, and a handle portion or 'handle wafer' (typically being bulk silicon) on the bottom. SOI wafers can be produced by using a SIMOX (Separation by IMplantation of Oxygen) process which uses a very high dose oxygen implant process followed by a high temperature anneal, or a wafer bonding process to achieve a thinner device layer that may have better thickness uniformity and lower defect density as compared to a SIMOX process.

SUMMARY

This Summary is provided to introduce a brief selection of disclosed concepts in a simplified form that are further described below in the Detailed Description including the drawings provided. This Summary is not intended to limit the claimed subject matter's scope.

Disclose aspects include a semiconductor device comprising an SOI substrate including a top device layer, a BOX layer in the middle, and a bottom handle portion. A filled trench is lined with one or more trench dielectric layer(s) that extends to the BOX layer, which defines an inner portion and an outer portion of the device layer. The semiconductor device includes a field effect transistor (FET) including an inner portion, there is a source region having a source contact thereto and a drain region having a drain contact thereto, each doped a first doping type. A gate region having a gate contact is separated from the inner portion by the trench dielectric. The source and drain region are separated by a body region doped a second doping type that has a body contact.

BRIEF DESCRIPTION OF THE DRAWINGS

Reference will now be made to the accompanying drawings, which are not necessarily drawn to scale, wherein.

DETAILED DESCRIPTION

Figure 1A:
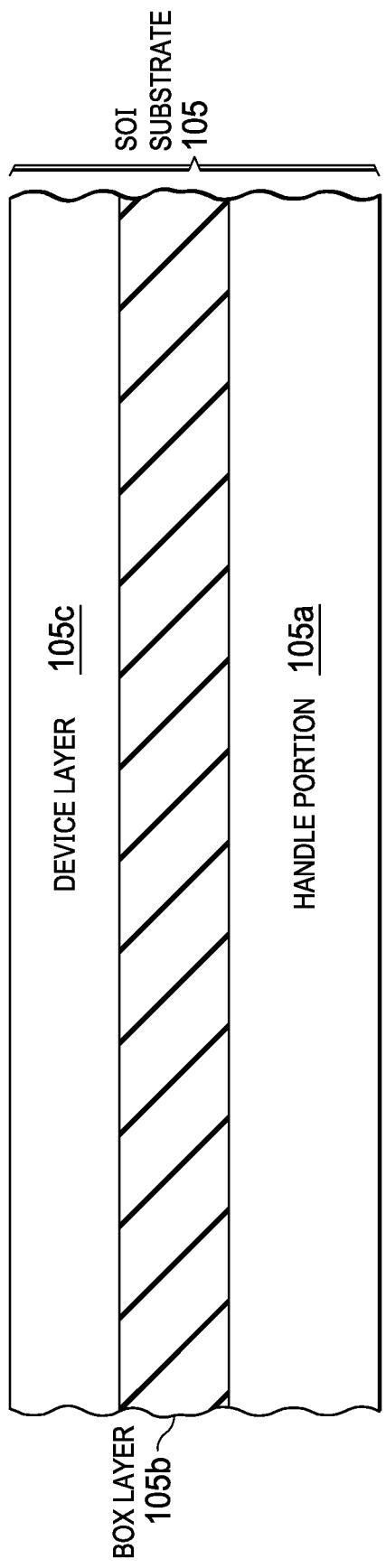
FIG. 1A-1J are schematic cross-sectional diagrams showing process progression for an example method of forming a semiconductor device using an SOI substrate comprising at least one FET that uses a trench dielectric as its gate dielectric or an IC having at least one of such FETs, shown forming an NFET and a PFET on a portion of an IC, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

In SOI processes that include at least one oxide-lined trench that reaches through the device layer down to at least the BOX layer, disclosed aspects include an NFET(s) and/or PFET(s) that utilize the trench dielectric as its gate dielectric. In operation, such FETs can generate an inversion layer that forms on the silicon sidewalls in the device layer of a filled trench when a voltage is applied across the trench dielectric. In addition to the source and drain terminals, disclosed FETs can also support HV biases applied to the gate since the trench dielectric being the gate dielectric due to its significantly higher thickness as compared to a conventional gate dielectric can serve as an HV tolerant gate dielectric, generally supporting a voltage of at least 50 V across the gate dielectric.

The gate voltage rating achieved by disclosed FETs will generally depend on the particular processing conditions as well as the width of the trench. Some disclosed FETs may provide a gate voltage rating of at least 150 V so that the gate voltage rating can be +/−150 V. In the case of disclosed ICs, such ICs may find uses in cost-sensitive applications where HV FETs are needed, such as for analog MUXs, current-sense monitors (CSMs), and HV sensors.

FIGS. 1A-1J are schematic cross-sectional diagrams showing process progression for an example method of forming a semiconductor device or IC using an SOI substrate comprising at least one FET that uses a trench dielectric as its gate dielectric, shown as an IC portion including an NFET and a PFET, where the IC includes at least one FET that uses a trench dielectric as its gate dielectric. Although this process progression shows forming both an NFET and a PFET, as noted above, disclosed semiconductor devices also include a single (discrete) FET that generally comprises a power FET.

FIG. 1A shows a portion of an IC showing a starting SOI substrate 105 (typically being a wafer including a plurality of individual die, such as hundreds or thousands of die) comprising a device layer 105c (or 'active layer') on the top, a BOX layer 105b in the middle, and a handle portion 105a on the bottom. In a typical disclosed aspect, the device layer 105c comprises silicon, the BOX layer 105b comprises silicon oxide, and the handle portion 105a comprises silicon. The device layer 105c can comprise a lower portion comprising single crystal silicon from an SOI substrate received from an SOI wafer vendor, and as described below the device layer can also include an upper portion comprising an epitaxial (epi) silicon layer on the lower portion. The device layer 105c including an optional epi layer can be from 1 µm to 10 µm thick, such as 3 µm to 6 µm thick, the BOX layer 105b can be from 0.2 µm to 4 µm thick and the handle portion 105a can be from 100 µm to 1,000 µm (1 mm) thick.

Figure 1B:
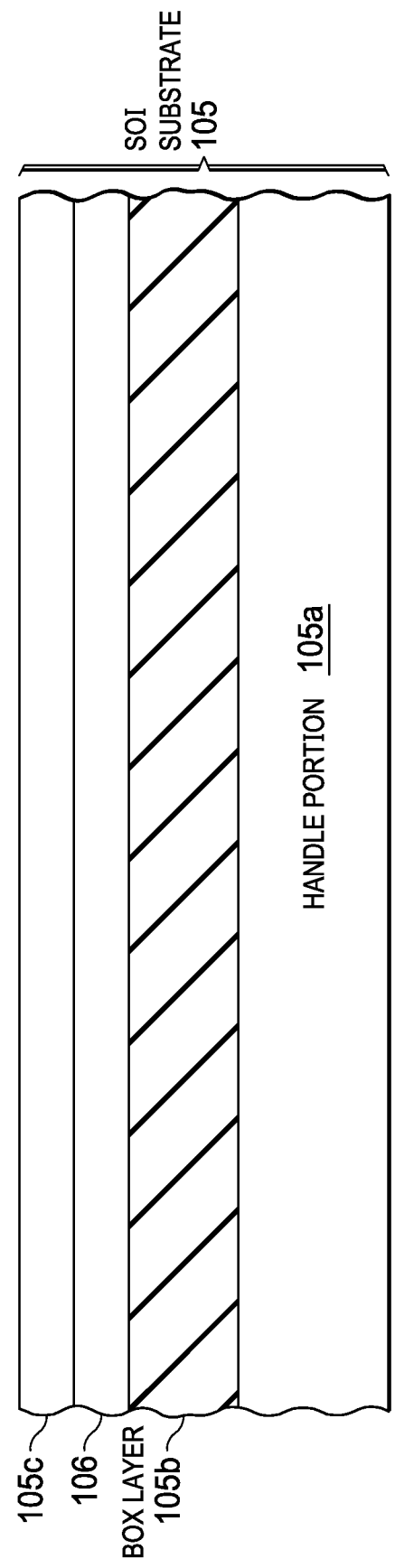
Figure 1C:
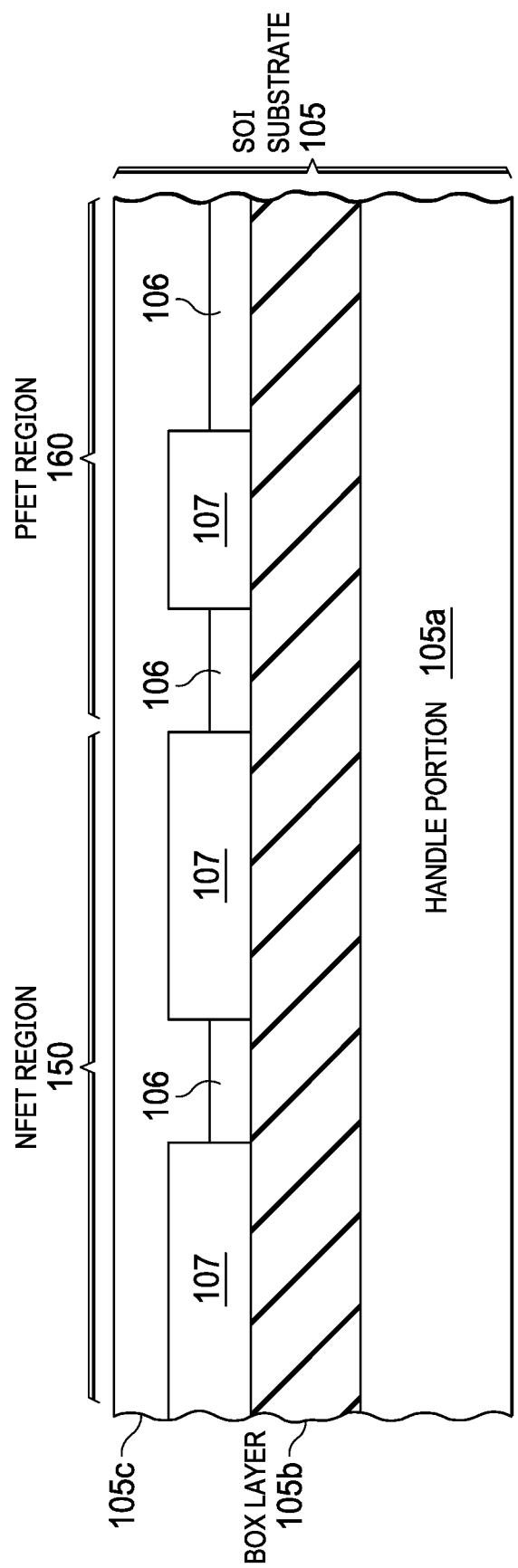
Figure 1D:
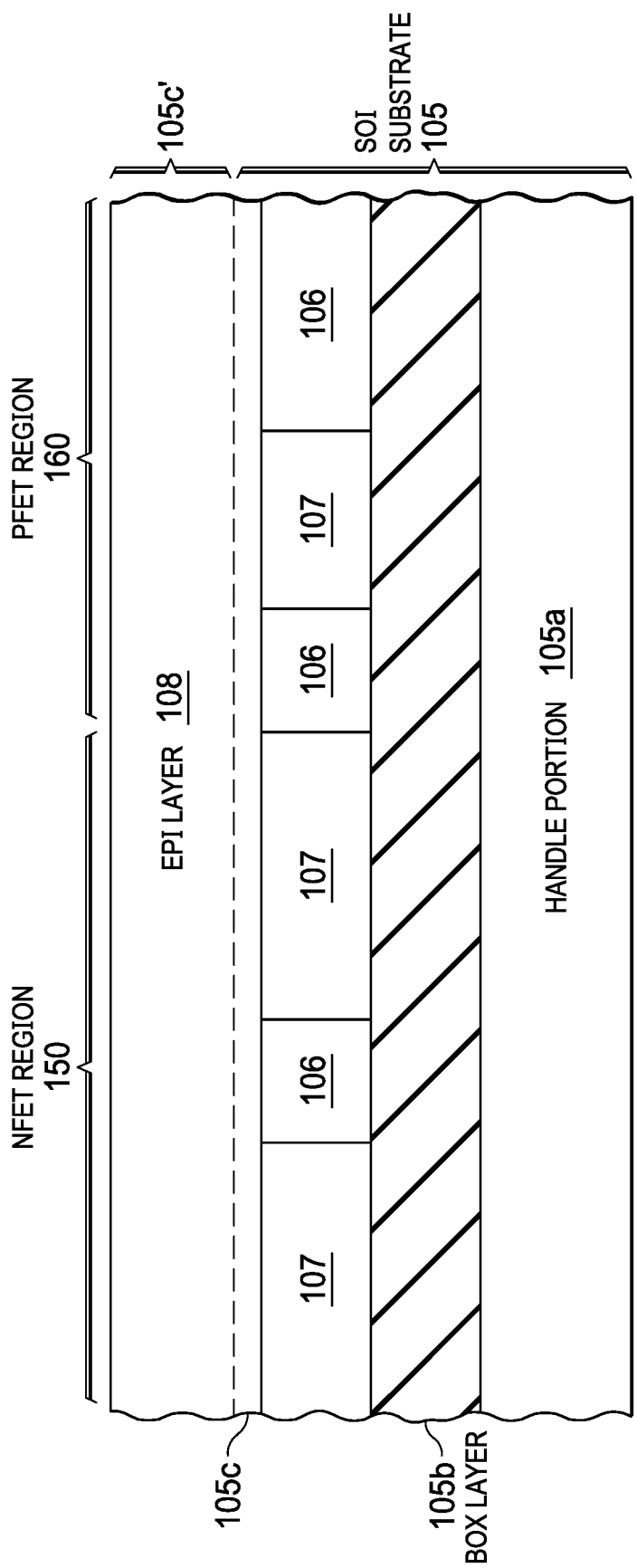

FIG. 1B is a cross-sectional view of the in-process IC portion following a blanket p-type buried layer (PBL) implant that forms an embedded PBL region 106 in the device layer 105c. Example conditions implant conditions for forming the PBL region 106 can comprise a boron implant with a dose ranging from $8\times10^{11}$ cm$^{-2}$ to $5\times10^{13}$ cm$^{-2}$ and an energy ranging from 100 KeV to 1,500 KeV. FIG. 1C is a cross-sectional view of the in-process IC portion following a masked n-type buried layer (NBL) implant that forms an embedded NBL region 107 in the device layer 105c.

Example conditions implant conditions for forming the NBL region 107 can comprise a phosphorous implant with a dose ranging from $1\times10^{12}$ cm$^{-2}$ to $1\times10^{14}$ cm$^{-2}$ and an energy in the range of 400 KeV to 1,200 KeV. The right side of FIG. 1C is now shown as a PFET region 160, and the left side is now shown as an NFET region 150. As noted above, an epi layer may then be optionally grown on the device layer 105c, shown as the EPI layer 108 in FIG. 1D. The epi layer 108 on the device layer 105c in FIG. 1D and hereafter is now collectively shown as 105c'. The epi layer 108 is generally doped the same type as the device layer 105c, and the epi layer 108 may be about 2.7 µm±30% thick, and may have a room temperature resistivity of about 10 ohm-cm±30%.

Figure 1E:
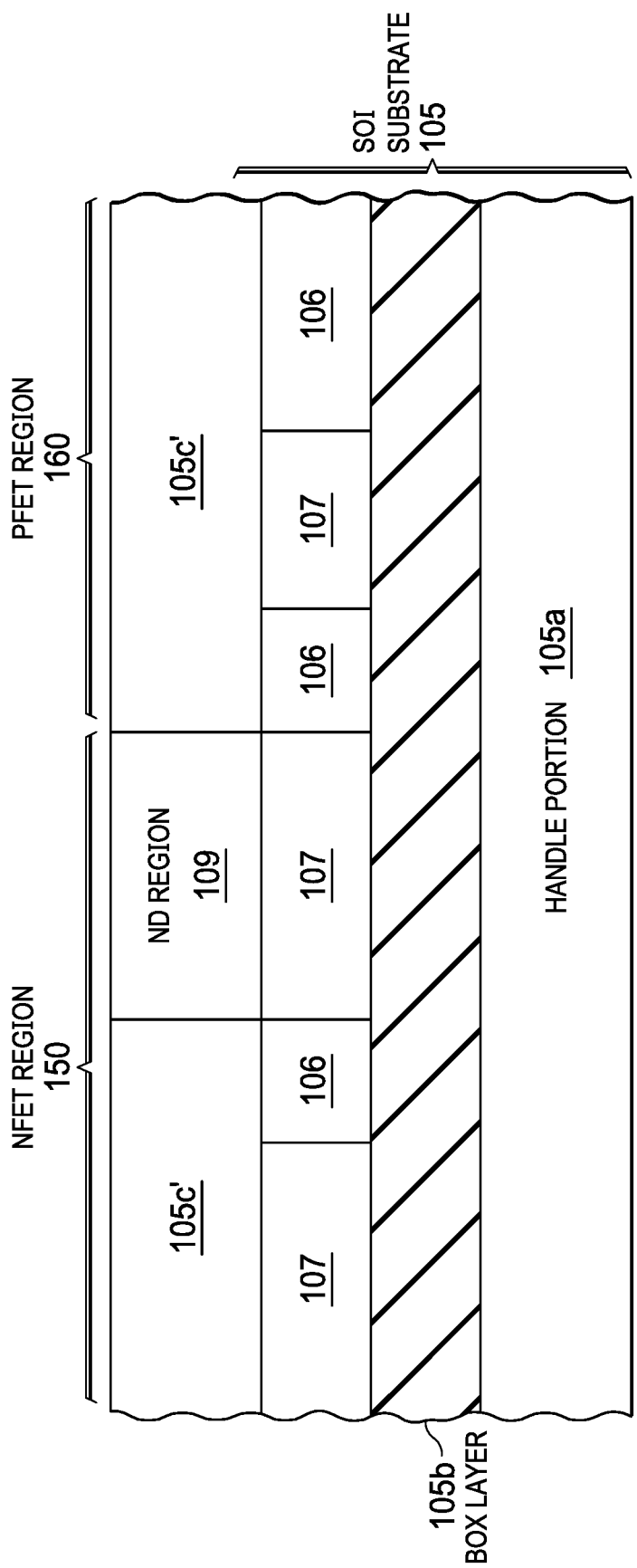

FIG. 1E shows the in-process IC portion after forming at least one deep n-region shown as an ND region 109 that provides a low resistance coupling from the top surface of the device layer 105c' to the NBL 107. Ion implantation is generally used for forming the ND region 109. Example conditions implant conditions for forming the ND region 109 can comprise a phosphorous chain implant including implant components having doses in the range from $8\times10^{11}$ cm$^{-2}$ to $5\times10^{12}$ cm$^{-2}$, and with energies in the range of 20 KeV to 1,000 KeV.

Figure 1F:
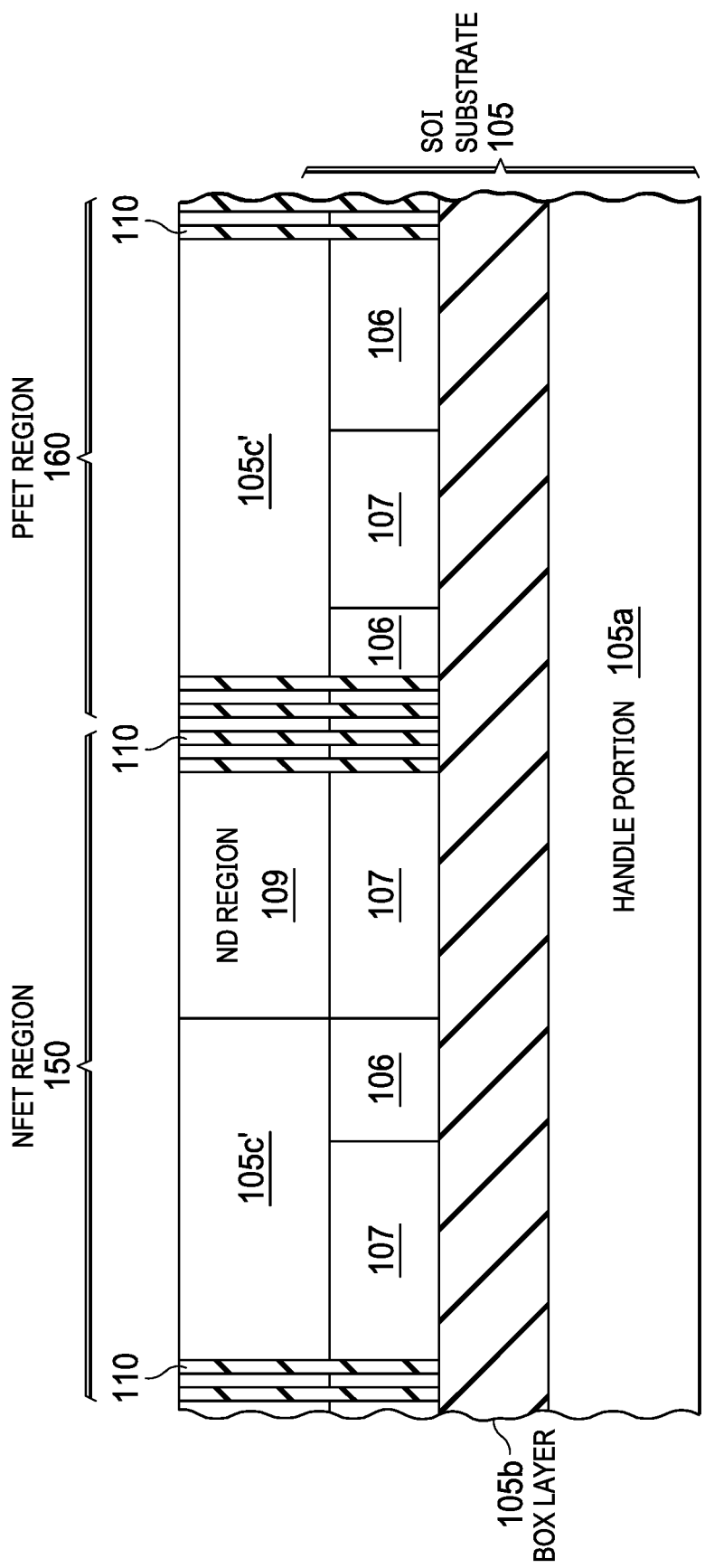

FIG. 1F shows the in-process IC after deep trench etching to form a plurality of trenches that reach to at least the BOX layer 105b, and then at least partially filling the trenches with at least one trench dielectric layer, with the filled trenches shown as 110. The gate region (illustrated in FIG. 1F as a thin device layer 105c' between filled trenches 110) may, in disclosed aspects, also include a single filled trench FET implementation in which the gate region is no longer in the thin device layer 105c' between filled trenches 110, but rather a doped polysilicon fill layer of a single filled trench 110.

Moreover, the filled trenches 110 need not provide an enclosed area of the device layer 105c'. For example, the first and second filled trenches 110 can bound only a portion of the gate region. This option is also discussed below regarding FIG. 1I.

A chemical mechanical planarization (CMP) process generally follows after the deposition(s) of the trench dielectric to localize the trench dielectric layers to only within the trenches. The trench etching can comprise deep reactive ion etching (DRIE) which anisotropically etches through any hard mask layer(s) present on the top surface, as well as through the epi layer 108 then the device layer 105c', and although not shown optionally through the BOX layer 105b. Etching through the box layer 105b enables forming what is herein referred to as a top-side-contact (TSC) trench, which allows biasing the handle portion 105a from the top side of the IC during operation of the IC.

In one arrangement, there is a thermal silicon oxide layer lining the filled trenches 110, comprising a deposited silicon oxide layer on a relatively thin thermal silicon oxide layer that is generally 100 Å to 3,000 Å thick, that together fills the lined trenches to provide the filled trenches 110. The deposited dielectric liner can comprise a sub-atmospheric chemical vapor deposition (SACVD) process generally performed at a temperature of 500° C. or higher.

A typical width for the trench is 0.5 µm to 2.5 µm, such as about 1 µm. In the case the filled trenches 110 are completely filled with only dielectric(s), the dielectric thickness equals the width of the filled trench 110. Although not shown, the filled trenches can include at least one TSC trench that generally has an inner layer of doped polysilicon that is electrically coupled to the handle portion 105a. In this case, the etching to form the TSC trench etches through the BOX layer 105b to reach the handle portion 105a. A typical width of TSC trench is 2 µm to 4 µm.

Figure 1G:
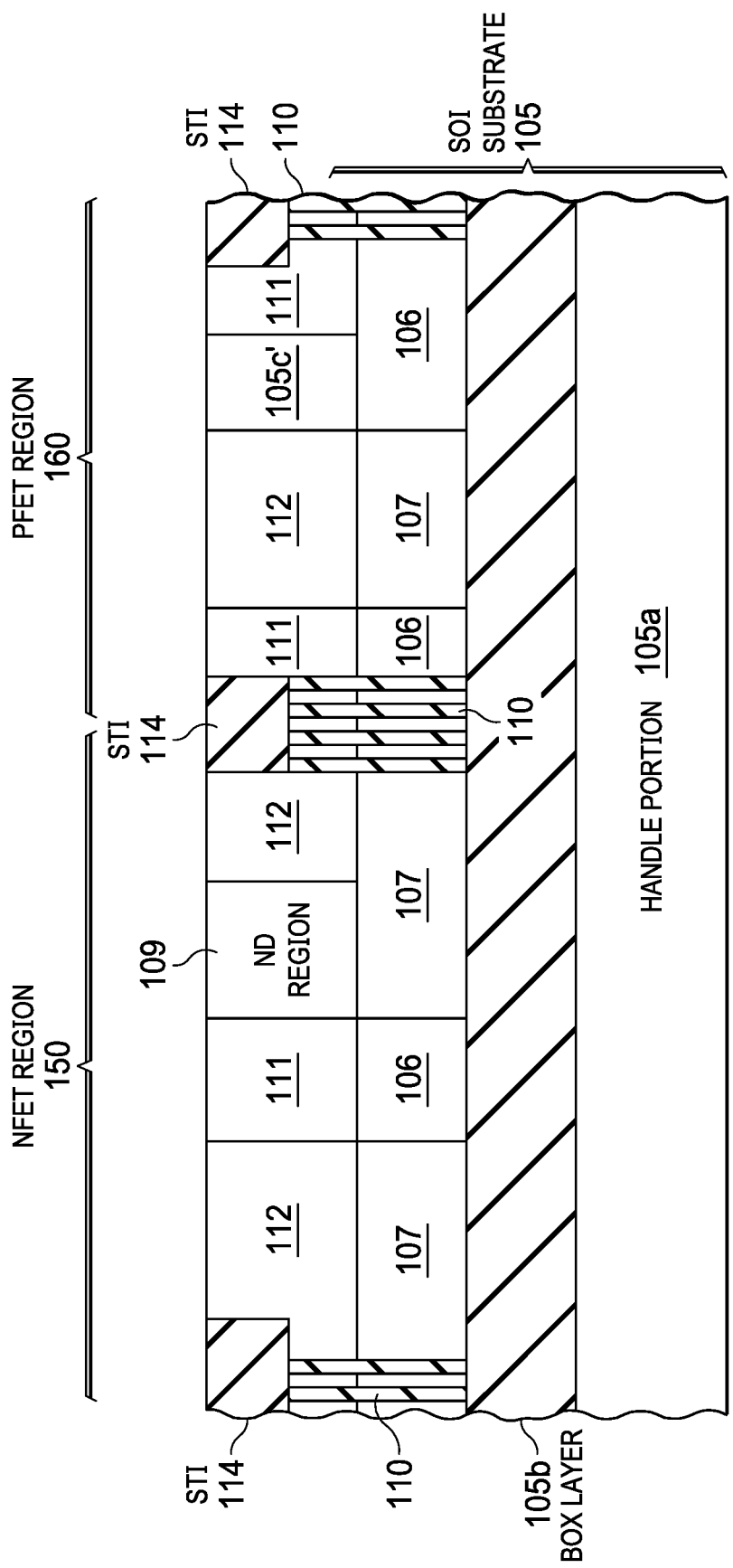

FIG. 1G shows the in-process IC portion after forming nwells shown as 112 and pwells shown as 111, shown both formed in the NFET region 150 and the PFET region 160s. Masked ion implantation is generally used for forming the nwells 112, and also for forming the pwells 111. Example conditions implant conditions for forming the nwells 112 can comprise a phosphorous chain implant with doses ranging from $1\times10^{12}$ cm$^{-2}$ to $3\times10^{14}$ cm$^{-2}$ with energies ranging from 100 KeV to 1,500 KeV. Implant conditions for forming the pwells 111 can comprise a boron chain implant with doses ranging from $1\times10^{12}$ cm$^{-2}$ to $3\times10^{14}$ cm$^{-2}$ with energies ranging from 10 KeV to 800 KeV. Optional shallow trench isolation (STI) regions 114 are also shown in FIG. 1G. In the particular trench process flow with the results shown in FIG. 1G, STI region 114 formation follows the formation of the filled trenches 110 with the STI regions 114 positioned above the filled trenches 110, so that the filled trenches 110 have STI regions 114 on their top that extend beyond the area of the filled trenches 110.

Figure 1H:
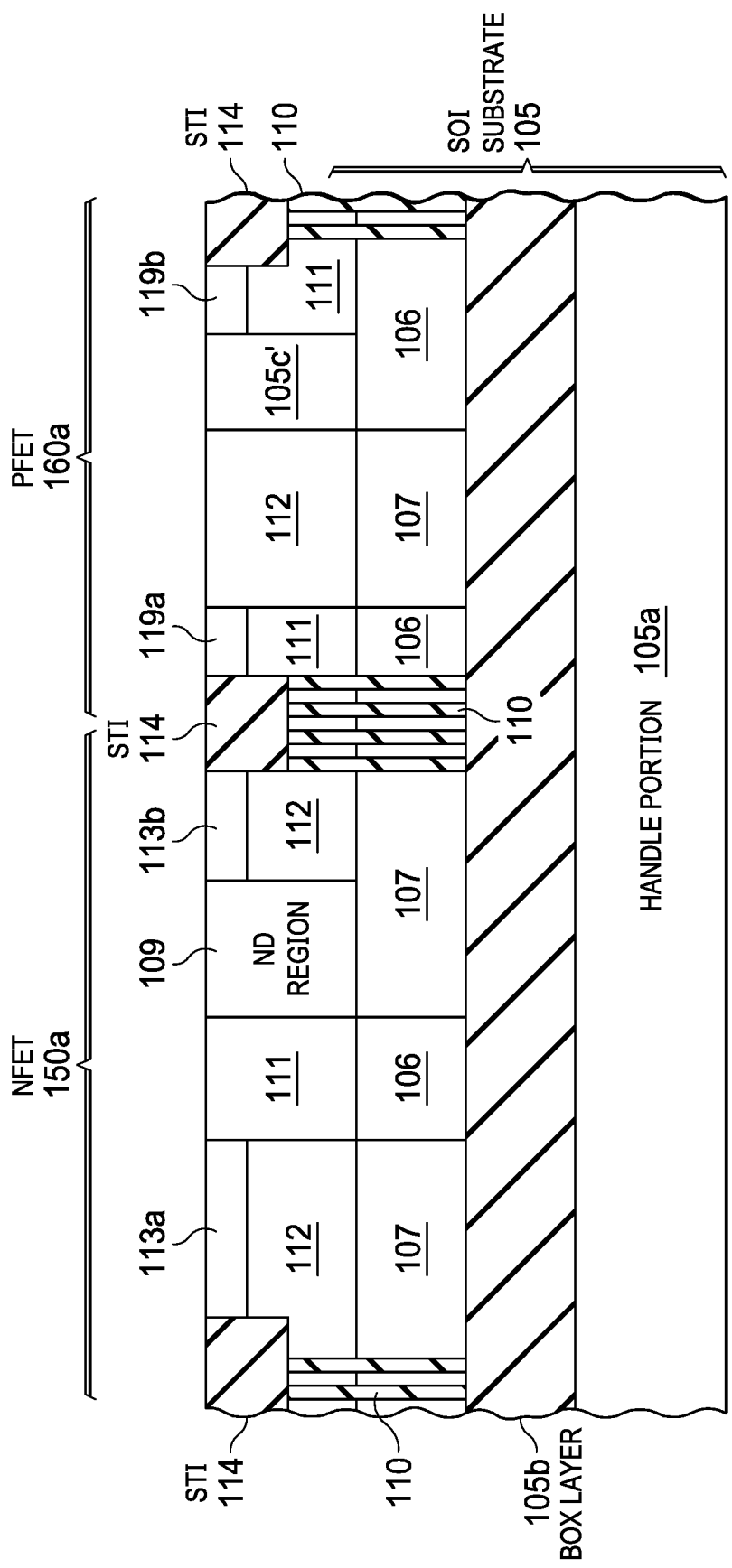

FIG. 1H shows the in-process IC portion after forming n-type source and drains shown as 113a, 113b, respectively, and after forming p-type source/drains shown as 119a, 119b, respectively. The previously shown NFET region 150 and PFET region 160 are now shown as NFET 150a and PFET 160a, respectively. Masked ion implantation is generally used for forming the n-type source/drains and the p-type source/drains. Typical n-type source/drains are formed using a combination of phosphorous and arsenic chain implants, with doses in the range of $1\times10^{13}$ cm$^{-2}$ to $5\times10^{15}$ cm$^{-2}$, and with phosphorous energies from 5 KeV to 60 KeV, and with arsenic energies from 20 KeV to 80 KeV. Typical p-type source/drain implants are formed with chain boron implants, with doses between $1\times10^{13}$ cm$^{-2}$ and $5\times10^{15}$ cm$^{-2}$, and energies ranging from 2 KeV to 20 KeV.

There may be a plurality of other regions formed on the SOI substrate 105 of the in-process IC that are not shown in FIG. 1H. For example, the additional regions can comprise a high-voltage p-drift region (HV PDRIFT) for the HV PFET, p-ZENER, a 48 v gate oxide, additional wells (e.g., DWELL), voltage threshold (VT) adjustment implant regions including one or more VTN regions, and VTP regions, and other gate dielectrics for low voltage FETs (such as for implementing logic) including relatively thin 5V and 1.5V gate oxides, polysilicon, and lightly doped drains (LDDs) including one or more of nLDDs and pLDDs.

Figure 1I:
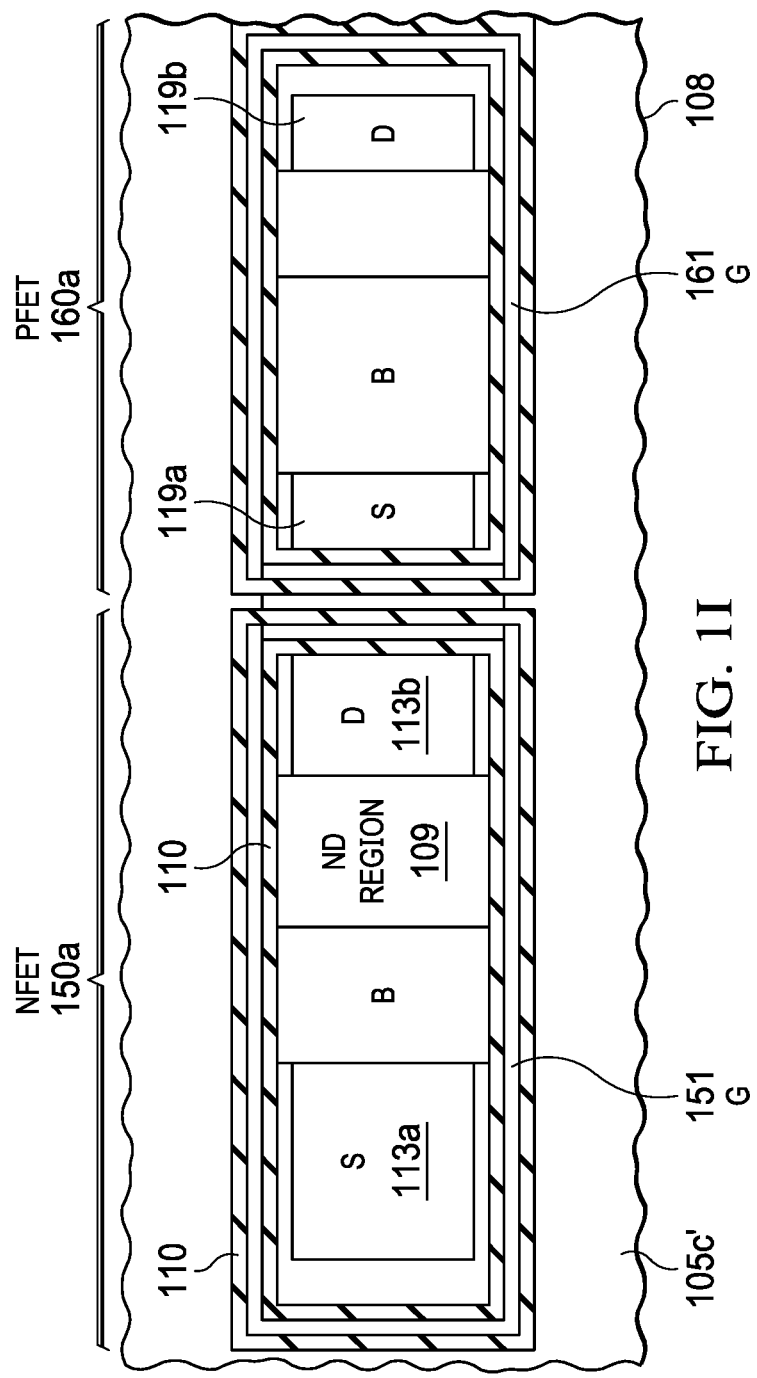

FIG. 1I is a top view showing the in-process IC portion shown in FIG. 1H. The NFET 150a is shown now with its gate as G 151 which between filled trenches 110, and the PFET as 160a is now shown with its gate as G 161 also between filled trenches 110. For simplicity, the STI regions 114 described above, including in FIG. 1H, are not shown in FIG. 1I.

As noted above, there is no need for both the first and second filled trenches 110 shown around the NFET 150 and around the PFET 160, as one filled trench 110 can be sufficient to provide a gate for a disclosed FET. However, having both a first and a second filled trench allows the gate to be electrically isolated. Moreover, as described above, the filled trench(es) 110 need not encircle the NFET 150a and the PFET 160a as shown in FIG. 1I, as the filled trench(es) 110 only need to bound a portion of the gate, such as being a linear segment, or being configured as a first and a second segment that are perpendicular to one another. However, having the filled trenches encircle the gate maximizes the drive current for the FET, as well as providing electrical isolation.

Figure 1J:
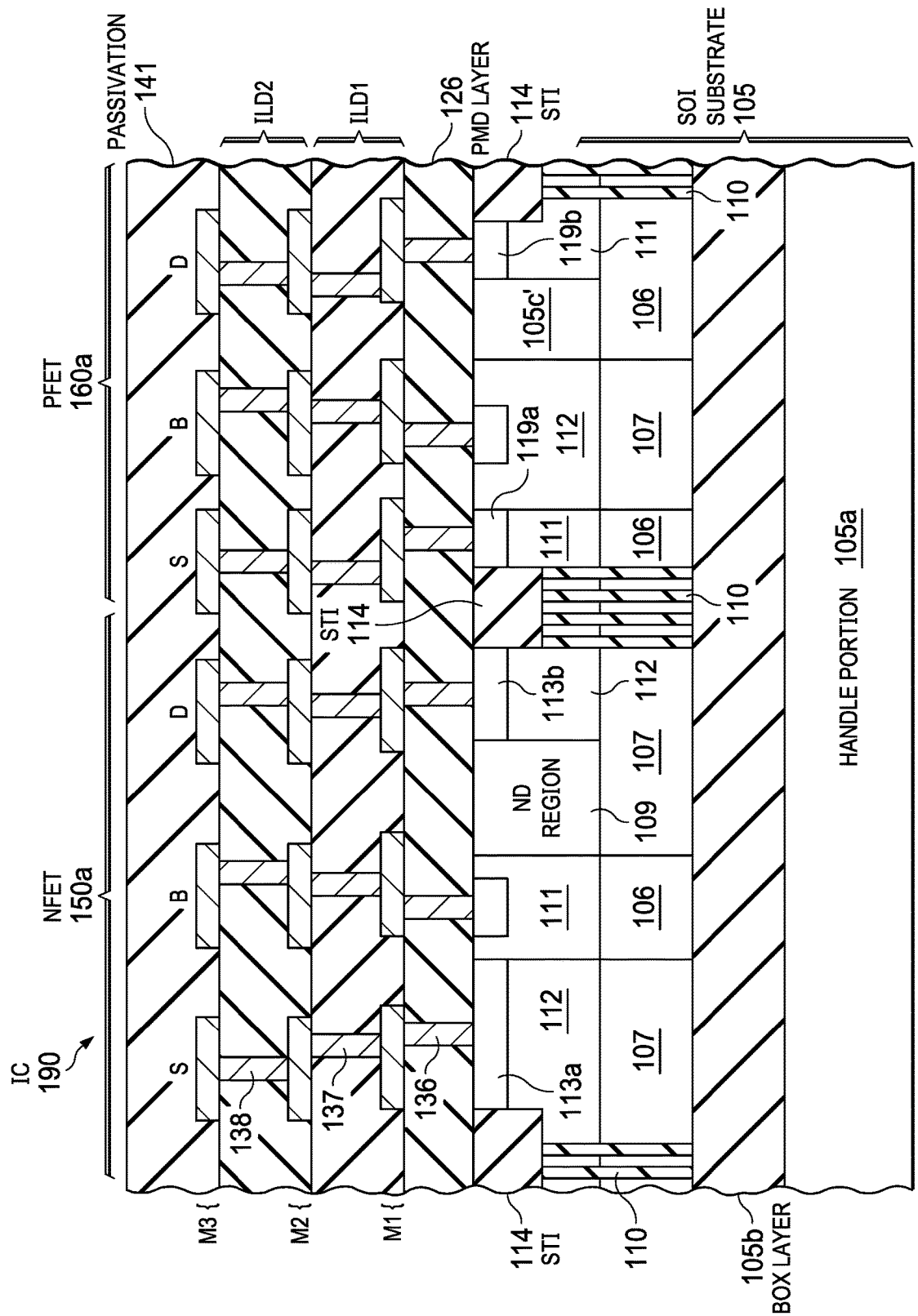

FIG. 1J is a cross-sectional view showing a portion of an example IC as IC 190 including the NFET 150a and the PFET 160a, that are electrically isolated from one another by filled trenches 110 together with the BOX layer 105b. STI regions 114 are again shown over the top of the filled trenches 110. STI regions 114 help electrically isolate the NFET 150a and the PFET 160a. FIG. 1J also shows the IC 190 after the formation of a multi-level metal stack comprising forming metal-filled contacts 136 through a pre-metal dielectric (PMD) layer 126, vias including via1s 137 through ILD1, and via2s 138 through ILD2, and three layers of patterned metallization shown as M1, M2, and M3, as well as a passivation layer 141 on the top of the IC 190. Although no gate contacts are shown in FIG. 1J, the gate contacts for the respective FETs would be made to the device layer 105c that is between the relatively closely spaced filled trenches 110.

Disclosed aspects also include FETs with a filled trench having a top-side contact that provides the gate for the FET. In this FET arrangement, the gate generally comprises doped polysilicon positioned inside the filled trench that provides a top-side gate contact, where the top-side gate contact is generally tied to the handle portion 105a. In this polysilicon gate FET arrangement, the dielectric thickness in the filled trench can be 0.3 µm to 2 µm, and the width of the filled trench can be 0.5 µm to 5 µm. A typical width for the filled trench for this FET arrangement is 3 µm, and a typical trench dielectric thickness is 0.6 µm. See FIGS. 6A and 6B described below which show an NFET 600 that uses a trench dielectric as its gate dielectric having its gate electrode provided by the doped polysilicon fill of a filled trench.

During operation of a disclosed FET, an inversion layer forms in the silicon region in the device layer 105c or 105c' across the trench dielectric, where the trench dielectric functions as a gate dielectric (i.e., a gate oxide). A gate region in this process flow as described below can be formed using the silicon island region between two filled trenches, wherein the silicon island serves as the gate for the FET, and the silicon oxide in the filled trench serves as a gate oxide for the FET.

Figure 2:
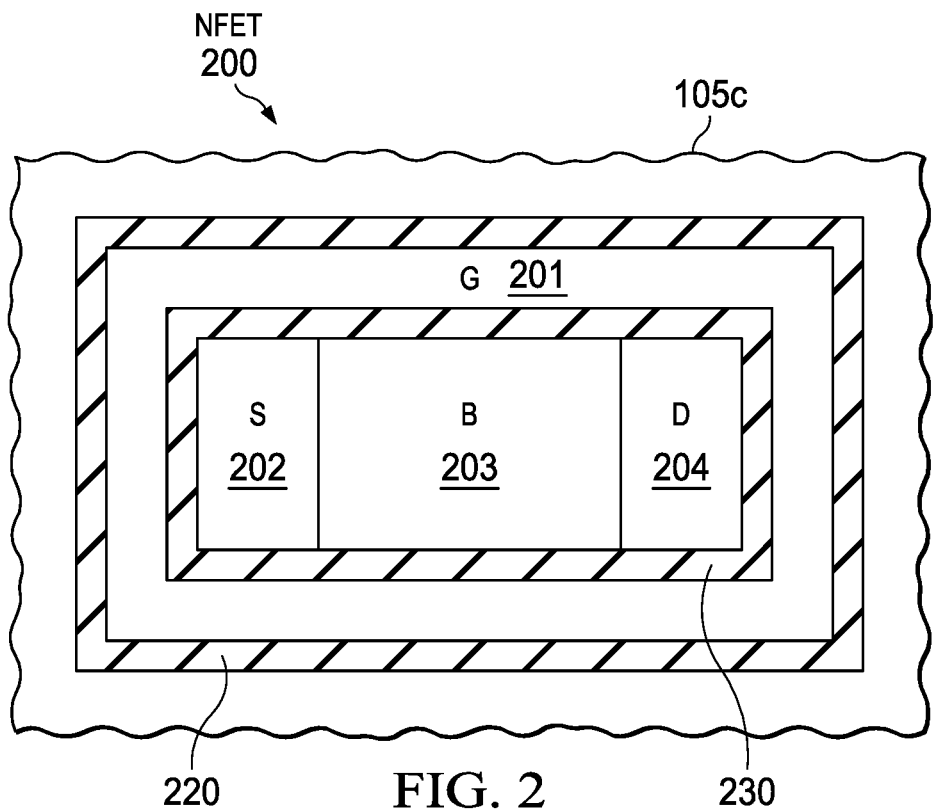
FIG. 2 is a top view depiction of a disclosed NFET that uses a trench dielectric as its gate dielectric.

FIG. 2 is a top view depiction of a disclosed FET 200 having a gate (G) 201 in the device layer 105c (with an optional epi layer thereon) between a first filled trench 220 and second filled trench 230. Although the G 201 of the FET 200 is shown between filled trenches 220 and 230 which are shown as rings, as described above, the FET only needs one filled trench. Moreover, the filled trenches need not be configured as a ring, such as being simply a linear segment side (or a short segment) of the gate, or one linear segment perpendicular to another linear segment. In FIG. 2 the other terminals of the FET 200 shown are the source (S) 202, body (B) 203, and drain (D) 204.

Figure 3:
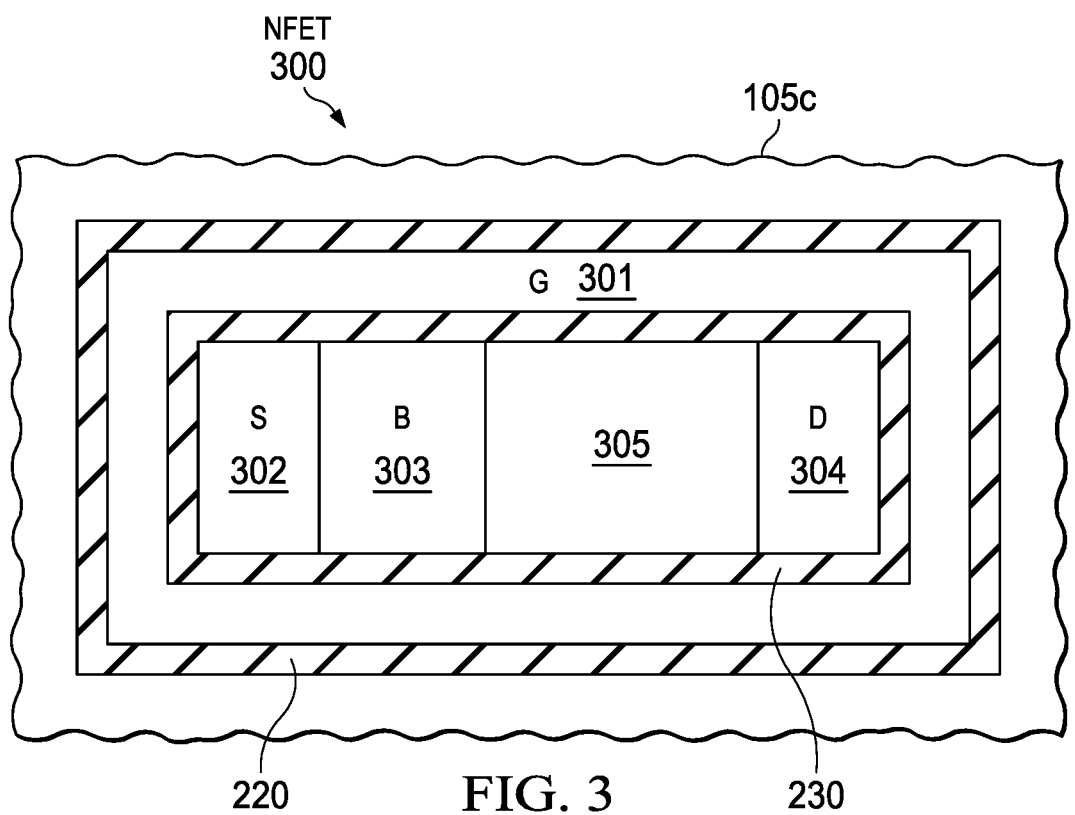
FIG. 3 is a top view depiction of a disclosed drain-extended NFET that uses a trench dielectric as its gate dielectric.

FIG. 3 is a top view depiction of a disclosed drain-extended NFET 300 formed in the device layer 105c. The filled trenches 220 and 230 are again shown as rings. The G is shown as 301, the S as 302, the B 303 shown as being a pwell, and the D 304. There is a ndrift region 305 shown between the B 303 and the D 304.

Figure 4A:
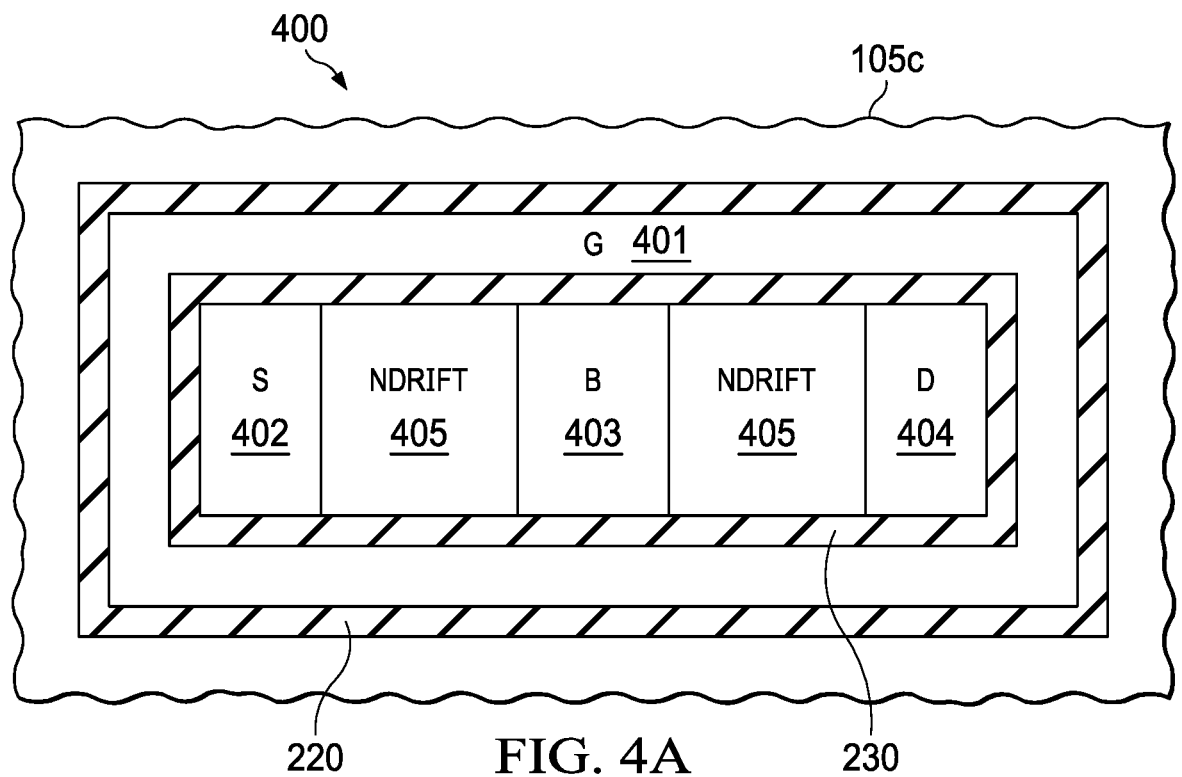
FIGS. 4A and 4B are top view depictions of a disclosed symmetric source and drain extended NFET and a disclosed PFET with a grounded (non-isolated) gate, respectively, both using a trench dielectric as their gate dielectric.
Figure 4B:
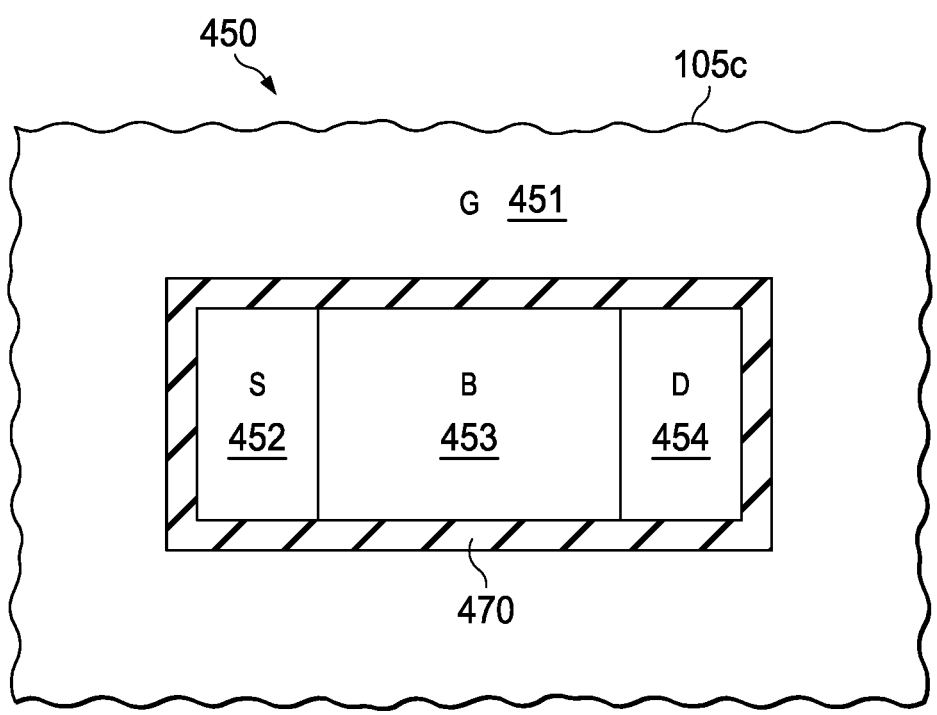

FIGS. 4A and 4B are top view depictions of a disclosed symmetric source and drain extended NFET 400 and a disclosed PFET 450 with a grounded (non-isolated) gate. The NFET 400 in FIG. 4A is shown comprising G 401, S 402, B 403, D 404, and Ndrift region 405, with all terminals except the G 401 being within filled trench 230, with the G 401 and the device layer 105c located between the filled trench 230 and the filled trench 220. The PFET 450 in FIG. 4B is shown comprising G 451, S 452, B 453, D 454, with all terminals within a single filled trench shown as 470.

Figure 5:
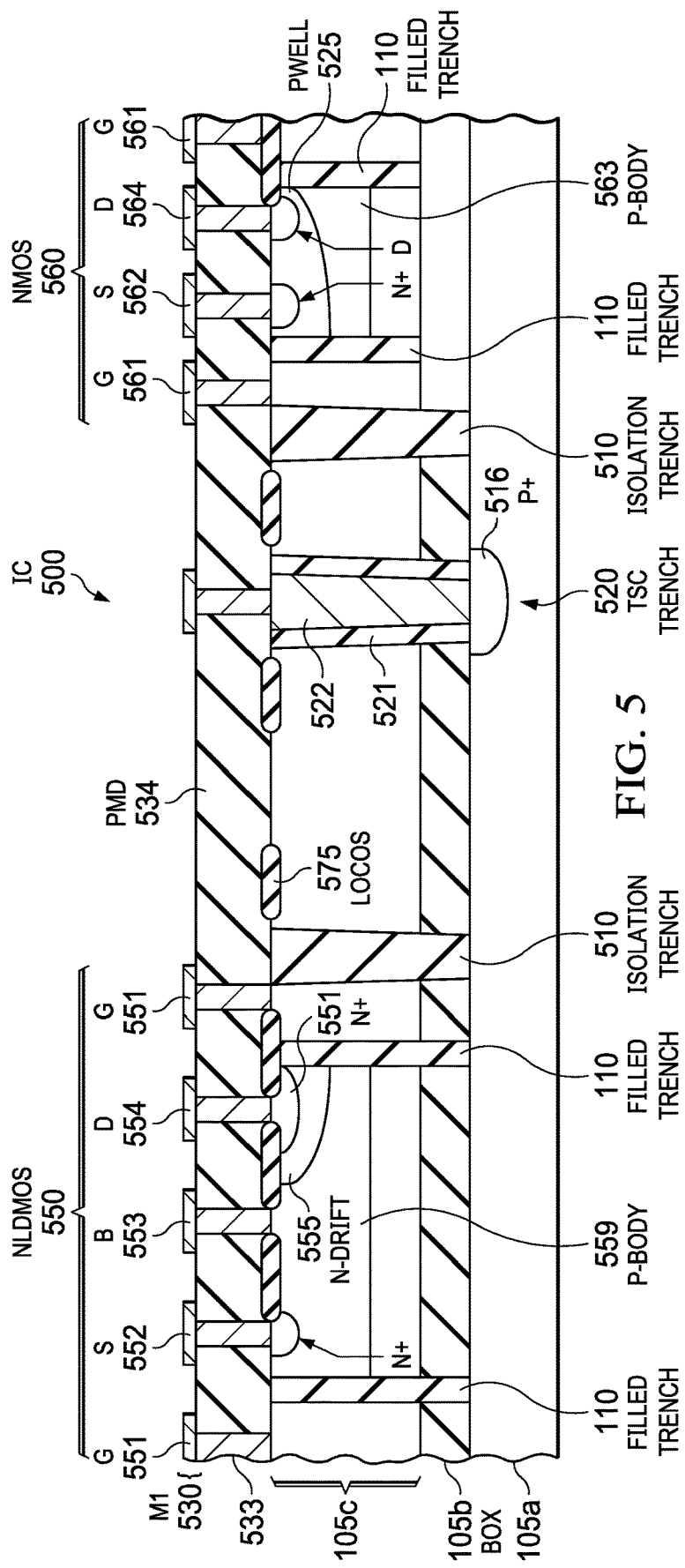
FIG. 5 is a cross-sectional view of an IC having FETs that use a trench dielectric as their gate dielectric positioned in the device areas, according to an example aspect.

FIG. 5 is a cross-sectional view of a portion of an IC 500 having transistors in the device layer 105c areas of an SOI substrate that are isolated from one another by isolation trenches 510, according to an example embodiment. The IC 500 is also shown having a TSC trench 520 including a trench dielectric 521, a polysilicon fill 522, and a p+ contact 516 to the handle portion 105a, that enables the top side of the IC 500 contact to the handle portion 105a. Because characteristics of different types of circuit components that are generally affected by a bias applied to the handle portion 105a, the TSC trench(es) 520 on the IC 500 provides the ability to control the voltage bias on the handle portion 105a at an appropriate bias level from the top side (device layer 105c) of the IC 500, without the conventional need for down bonds to either ground the handle portion 105a or to maintain the handle portion 105a at a desired voltage.

For simplicity, the metal stack is shown as only a patterned metal 1 (M1) layer 530 connecting through filled (e.g., tungsten (W) filled) vias 533 that are through a pre-metal dielectric (PMD) layer 534 to provide contact to features in or on the top surface of the device layer 105c. Typically, the metal stack will include 4 or more metal layers with an interlevel dielectric (ILD) layer having metal-filled vias therein for providing coupling between the respective metal layers.

The transistors shown for IC 500 both utilize filled trenches 110 for their gate dielectric shown comprising an n-channel laterally diffused metal-oxide-semiconductor (NLDMOS) transistor 550, and an n-channel MOS (NMOS) transistor 560 both formed in device layer 105c. The NLDMOS transistor 550 shown including contacts identified at the M1 contacts G contact 551 coupled to a gate region, S contact 552 coupled to a source region, and a B contact 553 coupled to a P-body region 559. There is also a D contact 554 coupled to the n+ region. NLDMOS transistor 550 also includes a N-drift region 555. The NMOS transistor 560 is shown including contacts identified at the M1 contacts including G contact 561 coupled to a gate region, S contact 562 coupled to a source region. The body is shown as a p-body 563 and D contact 564 the drain shown as D. There is a p-well 525 shown formed in the surface portion of the p-body 563, where the source region coupled to the S 562 and the drain region coupled to the D 564 are shown formed in the p-well 525.

The field oxide is shown as a LOCOS oxide 575, but as noted above can also comprise STI. As used herein, an LDMOS device is synonymous with a diffused metal oxide semiconductor (DMOS) or drain extended MOS (DEMOS) device, and can include both n-channel LDMOS (NLDMOS) and p-channel PLDMOS devices. In NLDMOS transistor 550, the D 554 is laterally arranged to allow current to laterally flow, and an n-drift region 555 formed in a p-body 559 is interposed between the channel and the drain coupled to the D contact 554 to provide a high D to S breakdown voltage (BV).

Regarding the NLDMOS transistor 550, the source region is connected to a S contact 552 (formed from the M1 layer 530) is within the p-body 559 that includes a B contact 553. The P-body 559 may be called a DWELL region. LDMOS devices are generally designed to achieve higher BV while minimizing their specific ON-resistance in order to reduce conduction power losses.

Figure 6A:
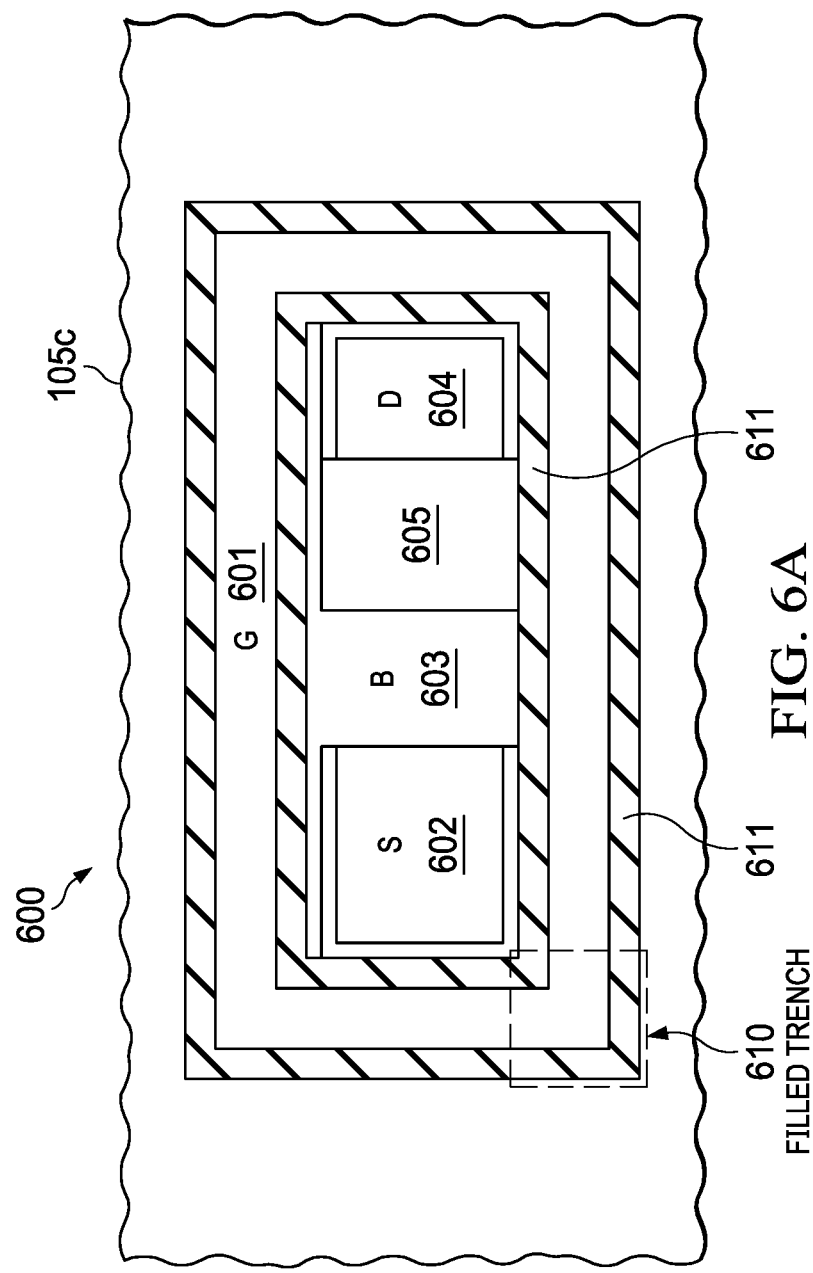
FIG. 6A is a top view of an NFET that uses a trench dielectric as its gate dielectric having its gate electrode provided by the fill polysilicon of a filled trench that provides the trench dielectric for the gate dielectric.
Figure 6B:
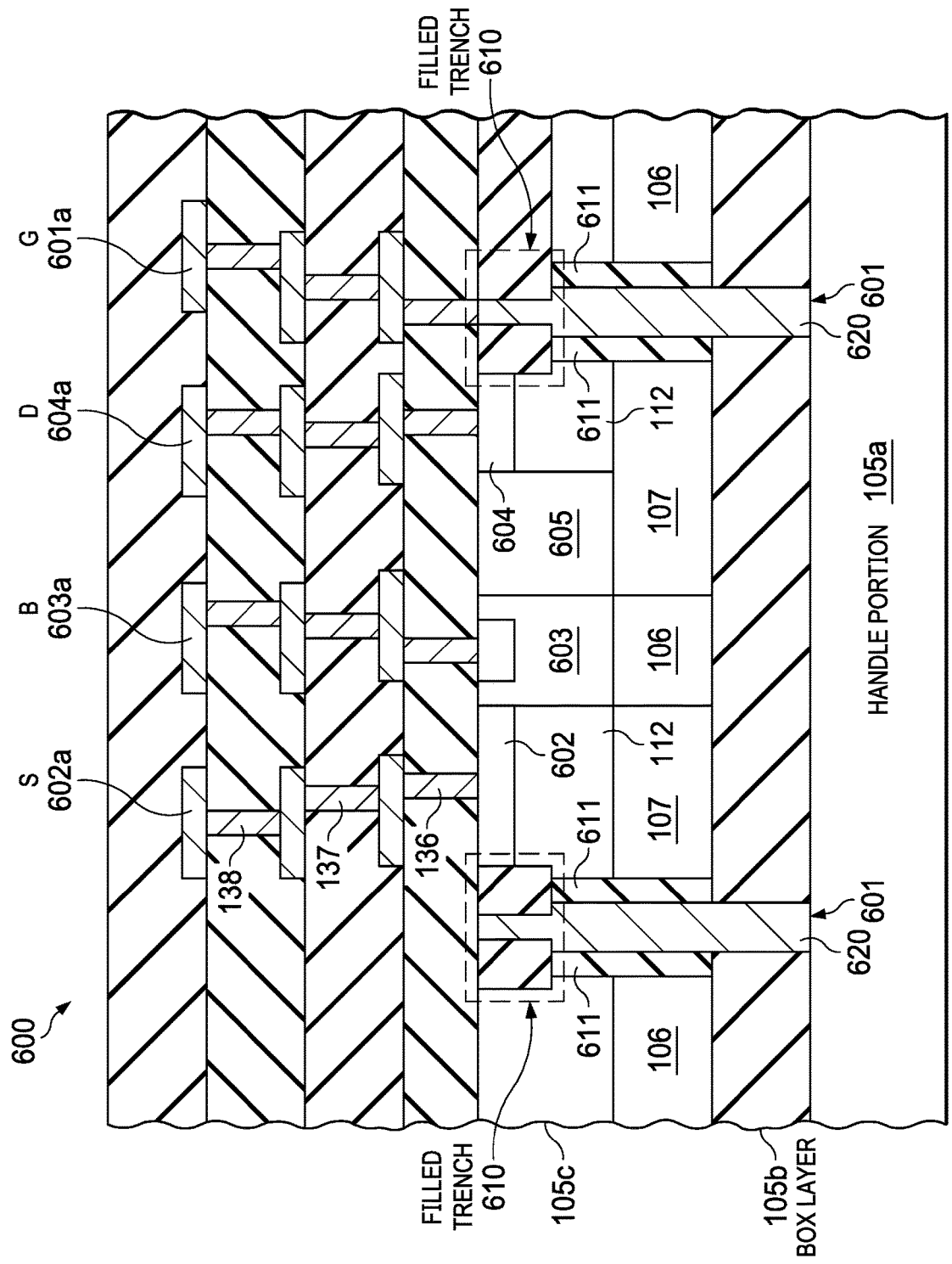
FIG. 6B is a cross-sectional view showing the NFET shown in FIG. 6A that also includes topside contacts to the S, B, D, and G terminals of the NFET.

FIG. 6A is a top view of an NFET 600 that uses the trench dielectric 611 of a filled trench 610 as its gate dielectric having its gate electrode (G) provided by the fill polysilicon 620. NFET 600 includes a S 602 having a S contact 602a, a B 603 having a B contact 603a, a D 604 having a D contact 604a, and a ndrift region 605 between the B 603 and the D 604. FIG. 6B is a cross-sectional view showing the NFET 600 shown in FIG. 6A, that now also includes multi-level metallization topside contacts shown as 602a to the S 602, 603a to the B 603, 604a to D 604, and 601a to the G 601.

As noted above, example applications for disclosed semiconductor devices include an HV analog MUX, CSM, and HV sensor. Disclosed semiconductor devices being HV tolerant FETs can replace the FETs with relatively thick gate oxide to support HV operation (e.g., a gate voltage of at least 100 V) as a lower-cost alternative.

Figure 7A:
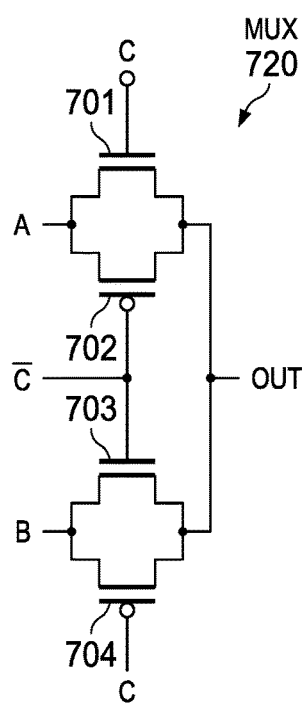
FIGS. 7A-C show a multiplexer (MUX), a current sensor, and a high-voltage (HV) sensor, respectively, that can all utilize an SOI substrate comprising at least one disclosed FET that uses a trench dielectric as its gate dielectric.
Figure 7B:
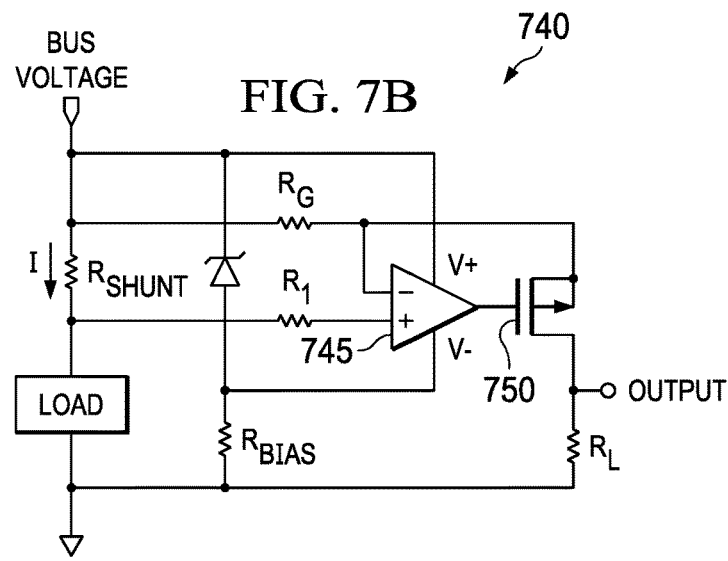
Figure 7C:
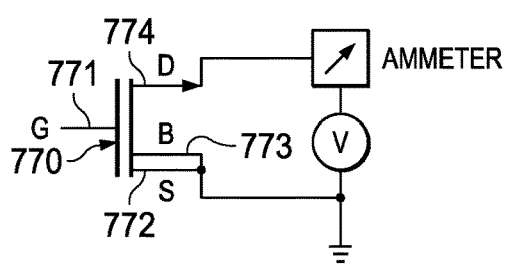

FIGS. 7A-C show a few example applications for disclosed FETs or ICs that utilizes an SOI substrate comprising at least one disclosed FET that uses a trench dielectric as its gate dielectric. FIG. 7A shows a MUX 720 having an upper MOS transmission gate 702 and a lower MOS transmission gate 703, also shown having MOS transistors 701 and 704. Regarding operation of MUX 720, when the control signal shown as C is low, then the upper MOS transmission gate 702 turns OFF and, as a result, it will thus not allow A to pass through it, at the same time the lower MOS transmission gate 703 is turned 'ON' so that it allows B to pass through it so that the output=B.

FIG. 7B shows a current sensor 740 comprising an operational amplifier 745 that has its output connected to the gate of an HV MOS transistor 750 that drives a load resistor shown as $R_L$ coupled to the output of the current sensor 740. The HV MOS transistor 750 can comprise a disclosed FET, and the operational amplifier 745 can include one or more disclosed FETs.

FIG. 7C shows an HV sensor 760, including MOS transistor 770 shown having a G 771, a S 772, a B 773, and a D 774. The B 773 is shown tied to the S 772. The MOS transistor 770 utilizes a trench dielectric as its gate dielectric. The HV voltage sensor 760 is used to calculate and monitor the voltage of an object. Voltage sensors such as HV sensor 760 can determine the AC voltage or the DC voltage level. An example implementation can involve supplying a small DC voltage to bias the D 774, S 772, and B 773 terminals while using the G 771 as a terminal to sense the voltage.

EXAMPLES

Disclosed aspects are further illustrated by the following specific Examples, which should not be construed as limiting the scope or content of this Disclosure in any way.

Figure 8:
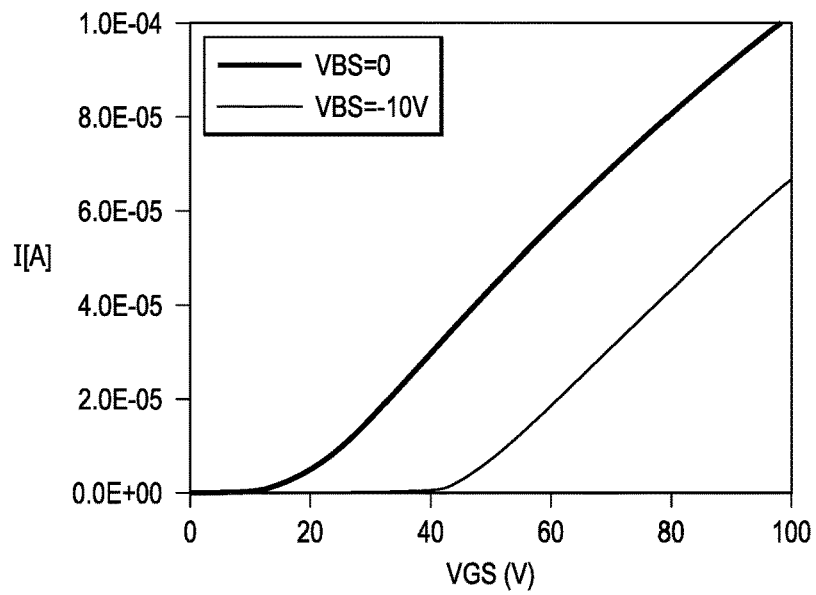
FIG. 8 shows measured device data in the linear operating region obtained from a disclosed NFET that uses a trench dielectric as its gate dielectric, with current plotted against gate to body (B) and source (S) bias $V_{BS}$, showing measured device data for both $V_{BS}=0$ V and $V_{BS}=-10$ V.

FIG. 8 shows measured data obtained from a disclosed NFET that uses a trench dielectric as its gate dielectric similar to the NFET 200 shown in FIG. 2A which is described above. For the NFET tested, the thickness of the trench dielectric providing the gate dielectric was about 1 μm. The measured data in FIG. 8 is shown in the linear region of the NFET up to a gate to source voltage (VGS) of 100 V, with the current plotted against the VGS, showing measured data for both VBS=zero V and VBS=−10 V. Although this measured data stops at a VGS of 100 V, as described above-disclosed FETs can generally operate with a VGS of at least ±150 V.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS, and MEMS.

Those skilled in the art to which this Disclosure relates will appreciate that many other aspects are possible within the scope of the claimed invention, and further additions, deletions, substitutions, and modifications may be made to the described aspects without departing from the scope of this Disclosure.

The invention claimed is:
1. A semiconductor device, comprising:
a Silicon-on-Insulator (SOI) substrate including a device layer on a top, a buried oxide (BOX) layer in a middle, and a handle portion on a bottom;
a first filled trench at least being lined with a trench dielectric layer, the first filled trench extending to at least the BOX layer for defining an inner portion and an outer portion of the device layer;
a first field effect transistor (FET) comprising:
in the inner portion a source region having a source contact thereto and a drain region having a drain contact thereto each doped a first doping type, the source region and the drain region separated by a body region doped a second doping type having a body contact; and a gate region having a gate contact thereto, the gate region separated from the inner portion by the trench dielectric.

2. The semiconductor device of claim 1, wherein the gate region is located in the outer portion.

3. The semiconductor device of claim 1, wherein a width of the first filled trench is 0.5 µm to 5 µm.

4. The semiconductor device of claim 1, wherein the first filled trench comprises a doped polysilicon fill on the trench dielectric layer, the doped polysilicon fill forming the gate region.

5. The semiconductor device of claim 1, further comprising a second filled trench in the outer portion bounding at least a portion of the gate region.

6. The semiconductor device of claim 1, further comprising a drift region doped the first doping type positioned between the drain region and the body region.

7. The semiconductor device of claim 1, further comprising a second filled trench positioned lateral relative to the first filled trench, and further comprising a second FET, the second FET comprising:
  a second gate region having a gate contact thereto, the gate region separated from the inner portion by the trench dielectric;
  in the inner portion a second source region having a second source contact thereto and a second drain region having a second drain contact thereto each doped the first doping type or the second doping type, the second source region and the second drain region separated by a second body region doped opposite to a doping type of the second drain and the second source having a second body contact,
  wherein the gate region and the second gate region are dielectrically isolated from one another.

8. The semiconductor device of claim 7, wherein the second filled trench comprises a top side contact (TSC) trench, wherein the inner doped polysilicon fill extends to ohmically contact the handle portion.

9. The semiconductor device of claim 1, wherein the first filled trench encircles the first FET.

10. The semiconductor device of claim 1, wherein a thickness of the trench dielectric layer is at least 0.3 µms.

11. The semiconductor device of claim 1, further comprising a shallow trench isolation (STI) region over the first filled trench.

12. A method of fabricating a semiconductor device, comprising:
  providing a Silicon-on-Insulator (SOI) substrate including a device layer on a top, a buried oxide (BOX) layer in a middle, and a handle portion on a bottom;
  forming a first filled trench at least being lined with a trench dielectric layer, the first filled trench extending at least to the BOX layer for defining an inner portion and an outer portion of the device layer;
  forming a first field effect transistor (FET) transistor, comprising:
    forming a gate region having a gate contact thereto, the gate region separated from the inner portion by the trench dielectric;
    forming in the inner portion a source region and a drain region each doped a first doping type, the source region and the drain region separated by a body region doped a second doping type having a body contact, and
    forming contacts including a gate contact to the gate region, a source contact to the source region, and a drain contact to the drain region.

13. The method of claim 12, wherein the gate region is located in the outer portion.

14. The method of claim 12, wherein a width of the first filled trench is 0.5 µm to 5 µm, and wherein a thickness of the trench dielectric layer is at least 0.3 µms.

15. The method of claim 12, wherein the first filled trench comprises a doped polysilicon fill on the trench dielectric layer, the doped polysilicon fill forming the gate region.

16. The method of claim 12, wherein the forming the at least a first filled trench further comprises forming a second filled trench that encircles the first filled trench for bounding at least a portion of the gate region.

17. The method of claim 12, wherein further comprising forming a drift region doped the first doping type positioned between the drain region and the body region.

18. The method of claim 12, further comprising forming a second filled trench positioned lateral relative to the first filled trench, wherein the first FET further comprises a second FET, the forming the second FET comprising:
  forming a second gate region having a gate contact thereto, the gate region separated from the inner portion by the trench dielectric;
  forming in the inner portion a second source region having a second source contact thereto and a second drain region having a second drain contact thereto each doped the first or the second doping type, the second source region and the second drain region separated by a second body region doped opposite to a doping type of the second drain region and the second source region having a second body contact.

19. The method of claim 18, wherein the second filled trench comprises a top side contact (TSC) trench, and wherein the inner doped polysilicon fill extends to ohmically contact the handle portion.

20. The method of claim 19, wherein the first filled trench encircles the first FET.

21. The method of claim 12, further comprising forming a shallow trench isolation (STI) region over the first filled trench.

22. The method of claim 12, wherein the forming of the trench dielectric layer comprises forming a thermal silicon oxide layer, then depositing a silicon oxide layer on the thermal silicon oxide layer.

* * * * *